US010553477B2

(12) United States Patent
Maestre Caro et al.

(10) Patent No.: US 10,553,477 B2
(45) Date of Patent: Feb. 4, 2020

(54) FORMING INTERCONNECTS WITH SELF-ASSEMBLED MONOLAYERS

(71) Applicants: Aranzazu Maestre Caro, Hillsboro, OR (US); Ramanan V. Chebiam, Hillsboro, OR (US); Intel Corporation, Santa Clara, CA (US)

(72) Inventors: Aranzazu Maestre Caro, Hillsboro, OR (US); Ramanan V. Chebiam, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/773,158

(22) PCT Filed: Dec. 4, 2015

(86) PCT No.: PCT/US2015/063875
§ 371 (c)(1),
(2) Date: May 2, 2018

(87) PCT Pub. No.: WO2017/095432
PCT Pub. Date: Jun. 8, 2017

(65) Prior Publication Data
US 2018/0323101 A1 Nov. 8, 2018

(51) Int. Cl.
*H01L 21/768* (2006.01)
*H01L 21/324* (2006.01)
(Continued)

(52) U.S. Cl.
CPC .... *H01L 21/76831* (2013.01); *C23C 18/1646* (2013.01); *H01L 21/324* (2013.01);
(Continued)

(58) Field of Classification Search
CPC .......... H01L 21/76831; H01L 25/0657; H01L 21/56; H01L 23/48; H01L 24/06;
(Continued)

(56) References Cited

U.S. PATENT DOCUMENTS

2002/0079487 A1 6/2002 Ramanath et al.
2008/0105979 A1 5/2008 Whelan et al.
(Continued)

FOREIGN PATENT DOCUMENTS

WO 2017095432 A1 6/2017

OTHER PUBLICATIONS

Chen, Sung-Te et al., "Nanoseeding via Dual Surface Modification of Alkyl Monolayer for Site-Controlled Electroless Metallization," Langmuir 2011, vol. 27, No. 18, Aug. 15, 2011, pp. 12143-12148.
(Continued)

*Primary Examiner* — Elias Ullah
(74) *Attorney, Agent, or Firm* — Patent Capital Group

(57) ABSTRACT

Embodiments of the disclosure are directed to using a SAM liner to promote electroless deposition of metal for integrated circuit interconnects. The SAM liner can be formed on a dielectric substrate. A protective layer can be formed on the SAM liner. The protective layer can double as a seed layer for electroless deposition of an interconnect metal. The interconnect metal can be deposited on the protective layer using electroless deposition. The dielectric, with the SAM liner, the protective layer, and the interconnect metal can be annealed to reflow the interconnect metal into trenches formed in the dielectric.

25 Claims, 10 Drawing Sheets

(51) Int. Cl.
    *C23C 18/16*      (2006.01)
    *B82Y 30/00*      (2011.01)
    *B82Y 40/00*      (2011.01)

(52) U.S. Cl.
    CPC .. H01L 21/76837 (2013.01); H01L 21/76874 (2013.01); *B82Y 30/00* (2013.01); *B82Y 40/00* (2013.01)

(58) Field of Classification Search
    CPC ......... H01L 24/09; H01L 24/20; H01L 24/31; H01L 24/43; H01L 24/48; H01L 24/73; H01L 25/50
    See application file for complete search history.

(56) References Cited

U.S. PATENT DOCUMENTS

2013/0099363 A1     4/2013    Chiang et al.
2013/0224511 A1     8/2013    Kolics

OTHER PUBLICATIONS

Chen, S.T., et al., "Characterization of Ultrathin Electroless Barriers Grown by Self-Aligned Deposition on Silicon-Based Dielectric Films," Journal of The Electrochemical Society, vol. 151, No. 10, Available electronically Sep. 1, 2004; 7 pages.

PCT International Search Report and Written Opinion issued in PCT Application No. PCT/US2015/063875 dated Aug. 18, 2016; 13 pages.

PCT International Preliminary Report on Patentability from PCT Application No. PCT/US2015/063875 dated Jun. 4, 2018; 11 pages.

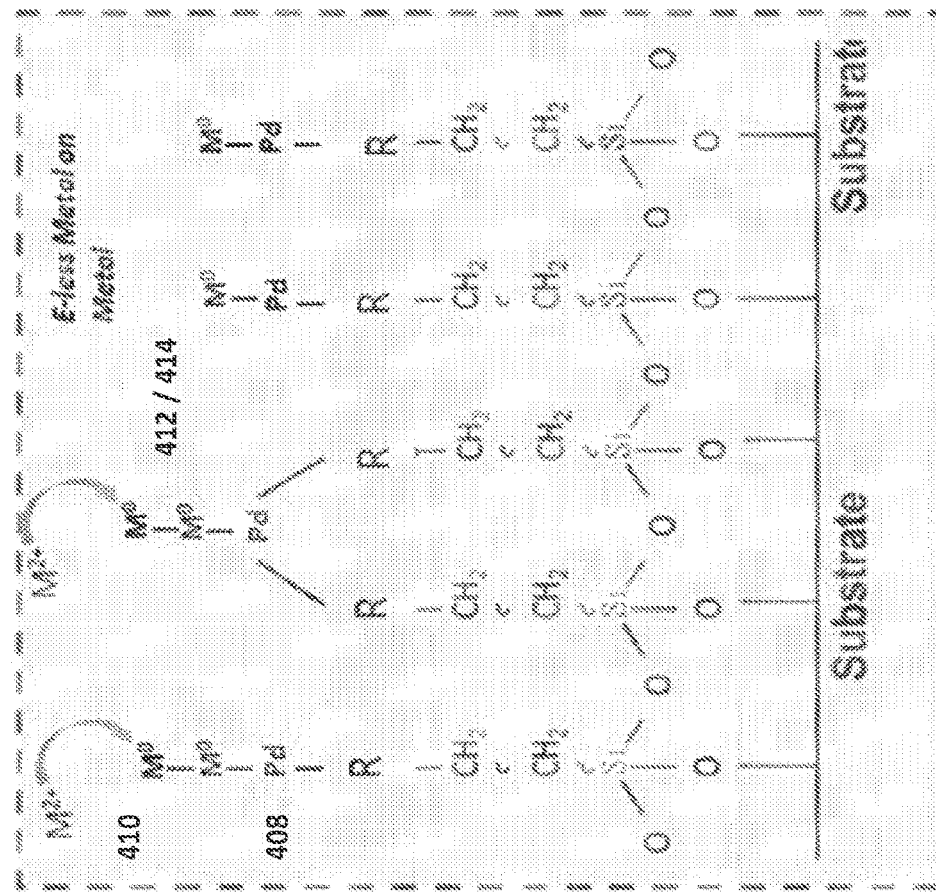
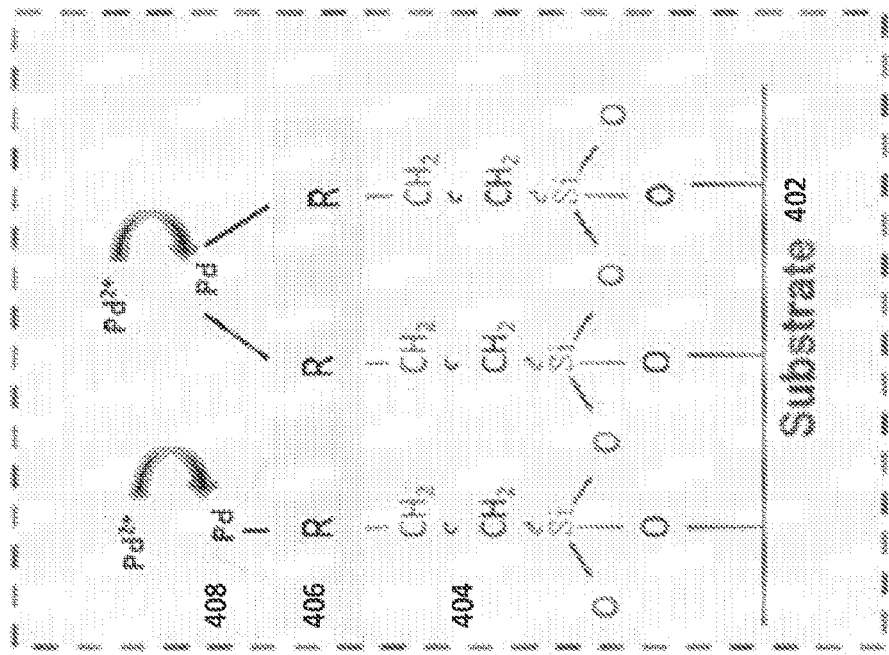
FIG. 4B
FIG. 4A

FORMING INTERCONNECTS WITH SELF-ASSEMBLED MONOLAYERS

CROSS-REFERENCE TO RELATED APPLICATIONS

This Application is a national stage application under 35 U.S.C. § 371 of PCT Application PCT/US2015/063875, filed Dec. 4, 2015, and entitled "FORMING INTERCONNECTS WITH SELF-ASSEMBLED MONOLAYERS," which is hereby incorporated by reference in its entirety.

TECHNICAL FIELD

This disclosure pertains to semiconductor processing, and more particularly to self-assembled monolayer (SAM) directed non-copper electroless metallization for barrierless interconnects.

BACKGROUND

Copper used in interconnects for integrated circuit technology benefits from a diffusion barrier to prevent degradation of conductivity and other properties of the copper interconnect and the integrated circuit in general. The use of a diffusion barrier for interconnects, however, may impact the resistivity of the interconnect as downscaling causes interconnect trenches to reduce in size because the diffusion barrier would encompass a higher percentage of the available space.

BRIEF DESCRIPTION OF THE DRAWINGS

FIG. 4A is a schematic diagram of terminating a self-assembled monolayer with a electroless deposition catalyst material.

FIG. 4B is a schematic diagram of electroless metal deposition in accordance with embodiments of the present disclosure.

DETAILED DESCRIPTION

Figure 1:
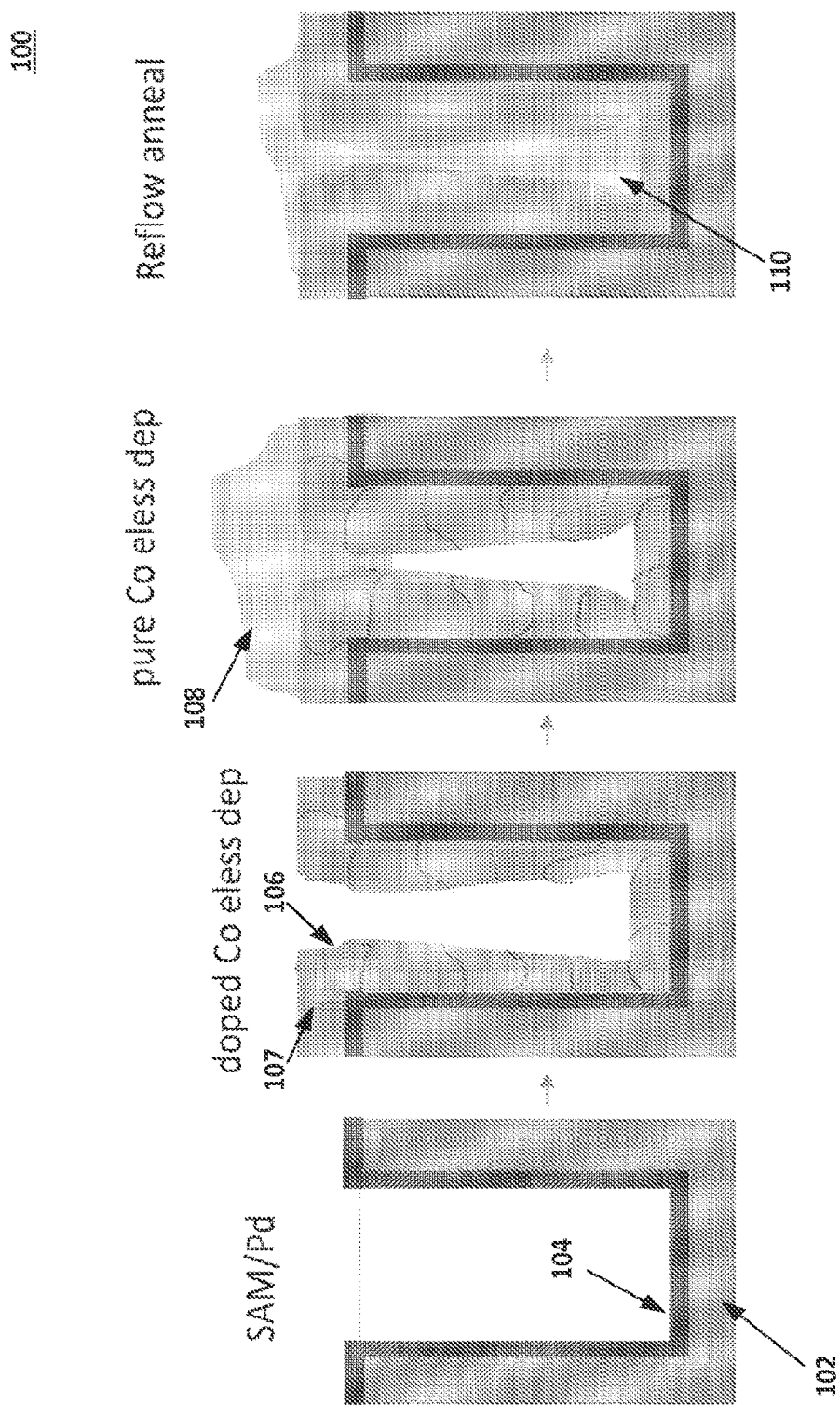
FIG. 1A-D are schematic block diagrams of a dielectric trench at various stages of self-assembled monolayer directed electroless deposition of an interconnect in accordance with embodiments of the present disclosure.

The present disclosure describes a barrierless wire gapfill that can be applied to trench sizes on the order of less than 10 nm. A non-copper metal can be used that does not require a barrier (or includes a smaller liner) while also providing an electrical resistivity analogous to a copper system. A metal that has a competitive bulk resistivity in comparison with barrier/Cu systems at small dimensions can be used, such as cobalt, ruthenium, platinum, palladium, tungsten, iridium, rhenium, nickel, etc.

By using a metal for the interconnect that does not require a diffusion barrier (or that has a very thin liner), the largest conductive area can be realized at the smallest dimensions.

In embodiments, non-copper can be applied using electroless plating, which would be advantageous over other deposition techniques, such as physical vapor deposition, chemical vapor deposition, vapor phase deposition, or atomic layer deposition, each of which may still require a liner of thickness that would result in unsatisfactory conductance characteristics of the resulting wire.

Electroless is one of the metallization techniques that may be able to fill feature sizes below 10 nm. In order to minimize the liner size needed for electroless activation while maintaining adhesion with the surface dielectric, this disclosure describes using self-assembled monolayers to promote metal electroless nucleation and growth.

This disclosure describes forming wires for interconnects using self-assembled monolayer (SAM) to promote electroless metallization. After SAM deposition and catalyst activation, metallization can include the following steps:

1—Acidic Cobalt electroless seed cover the SAM layer and protects it from alkaline chemistries; a bath configuration with PH<7 is considered acidic (e.g., dimethylaminoborane (DMAB)).

2—Alkaline pure Cobalt electroless will fill the remain of the structure; bath configuration with PH>7 are alkaline, where highly alkaline baths can be pH>10 (e.g., hydrazine).

3—Anneal treatment will allow the pure Cobalt to reflow and heal the grain boundaries and voids left and reduce the resistivity of the final wire.

The disclosure also describes protecting the SAM liner with a less conductive metal, which would be more conductive than traditional barriers as Ta/TaN or liners as TiN. The high conductance metal can be plated on the less conductive metal, which partially fills the gaps. An annealing treatment can be applied to reflow the high conductance metal inside the trenches and heal the grain boundaries of the more resistive metal, making the average more conductive than the barrier/liner approach.

The result includes interconnects with a conductive area comparable to copper by using SAM liner and electroless metal deposition.

The electroless deposition of metals leads in most of the cases to metal deposits that contain dopants. This makes them more resistive than pure metal systems. Electroless deposition of pure metals can be achieved using the right chemistries (i.e., selecting specific reducing agents, using specific additives, etc.). For example, pure Co electroless deposition can be done using Hydrazine as reducing agent (pH>12), such as dimethylamineborane (DMAB), hypophosphates, etc.

This disclosure uses an acidic electroless bath to plate and protect the SAM liner enabling a first layer of metal (a protective layer, e.g., doped cobalt). The created thin metal film (protective layer) is used as seed layer for the (alkaline bath) electroless deposition of the interconnect layer (e.g., pure cobalt). The interconnect layer, after an anneal treatment, can be reflowed and fill the remaining gap and at the same time heal the grain boundaries of the doped electroless metal (acidic) as shown in FIG. 1A-D below.

FIG. 1A-D are schematic block diagrams 100 of a dielectric trench at various stages of self-assembled monolayer directed electroless plating of an interconnect in accordance with embodiments of the present disclosure.

In FIG. 1A, the dielectric surface 102 can be formed into a trench, which is defined by two towers separated by a space. The dielectric surface 102 can include silicon oxide, for example. In FIG. 1A, a self-assembled monolayer (SAM) 104 has been formed on the surface of the dielectric 102, and the SAM 104 has been functionalized with or terminated by a metal atom (in this case, palladium). The metal atom can be used to catalyze the electroless deposition.

In FIG. 1B, a protective layer 106 has been formed on the SAM 104. The protective layer 106 is added to protect the SAM 104 from the alkaline bath used for electroless deposition of interconnect metal. The protective layer 106 can be introduced via electroless deposition techniques using an acidic bath, which would not be reactive with the SAM 104. More particularly, the acidic bath would not damage the SAM 104. The acidic bath reacts with the top functional group (shown as R in FIG. 3A, R 312). However, the acidic bath is such that it does not damage the linkage of SAM 104 with the dielectric surface 102 and between the SAM 104 molecules (e.g., O—Si—O bonds).

Figure 7A:
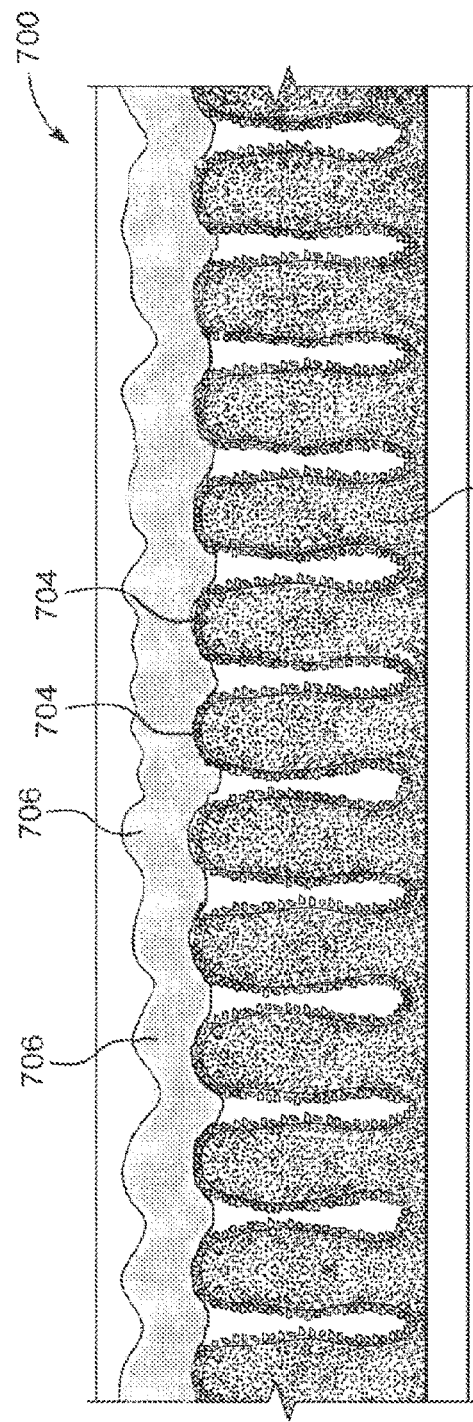
FIG. 7A is a scanning electron microscopy image of a cross section of a dielectric substrate with a self-assembled monolayer, a protective layer, and a metallization layer prior to annealing in accordance with embodiments of the present disclosure.

The electroless deposition of the protective layer 106 can be catalyzed by the metal atom terminated SAM 104. FIG. 1B also shows lines 107 that represent granularity of the protective layer prior to annealing. The lines 107 are visible in electron microscopy, as shown in FIG. 7A.

In FIG. 1C, an interconnect layer or metallization layer is deposited on the protective layer 106 by electroless deposition techniques. In some embodiments, a reducing agent is selected to mitigate the introduction of dopant materials or other impurities into the interconnect layer 108. In some embodiments, the reducing agent is hydrazine, and the electroless deposition uses an alkaline bath.

In FIG. 1D, the dielectric 102, the SAM 104, the protective layer 106, and the interconnect layer 108 are annealed. Annealing causes reflow of the interconnect layer 108 into the trench. The interconnect 110 establishes the gapfill in the trench. The annealing can be performed at temperatures on the order of 450 C.

Figure 2:
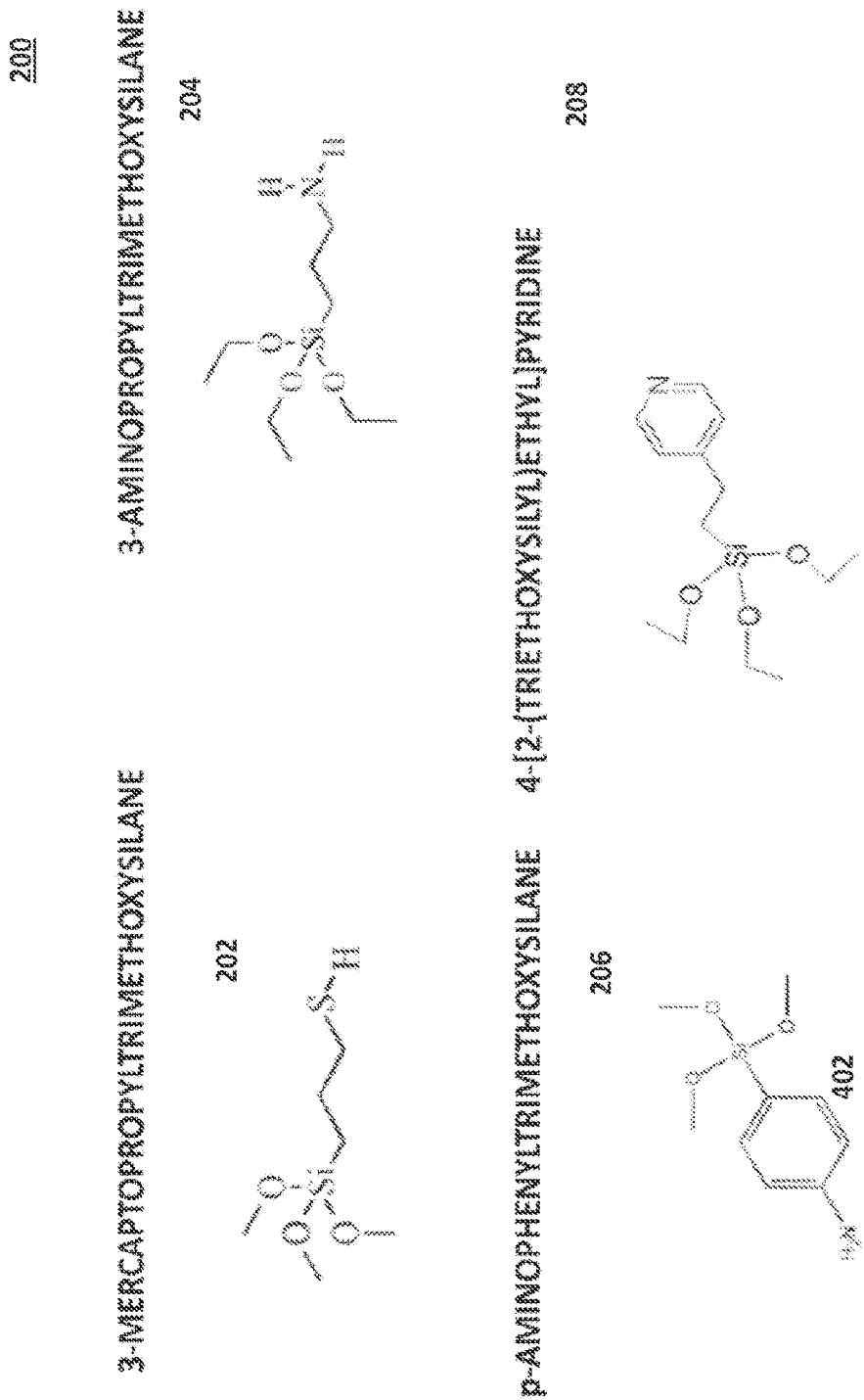
FIG. 2 is a schematic diagram of representative molecules for a self-assembled monolayer in accordance with embodiments of the present disclosure.

FIG. 2 is a schematic diagram 200 of representative molecules for a self-assembled monolayer (SAM) in accordance with embodiments of the present disclosure. Generally, siloxane SAMs are used in embodiments of this disclosure because of their head groups that can anchor on the dielectric. Additionally, the SAMs have a reactive terminal group that can allow a catalyst chemisorption (i.e., the SAM can be terminated by a catalyst that is added to the end of the reactive terminal group of the SAM molecule). Examples of reactive terminal groups are SH (thiol). COOH (carboxilic acid) or COO$^-$ (carboxylates salts), NH2, amines (primary, secondary or tertiary amines), mono or poly aminated (1, 2 or 3 amines in the same chain), NH2-C6H5 (aniline), C5H5N (Pyridyl), or M$^{n+}$ (metal atom terminated SAMs, which includes any metal that could catalyzed an electroless reaction). Specific examples of SAMs include 3-mercaptopropyltrimethoxysilane 202, 3-aminopropltrimethoxysilane 204, p-aminophenyltrimethoxysilane 206, and 4-[2-(triethoxysilyl)ethyl]pyridine 208.

Figures 3A, 3B, 3C:
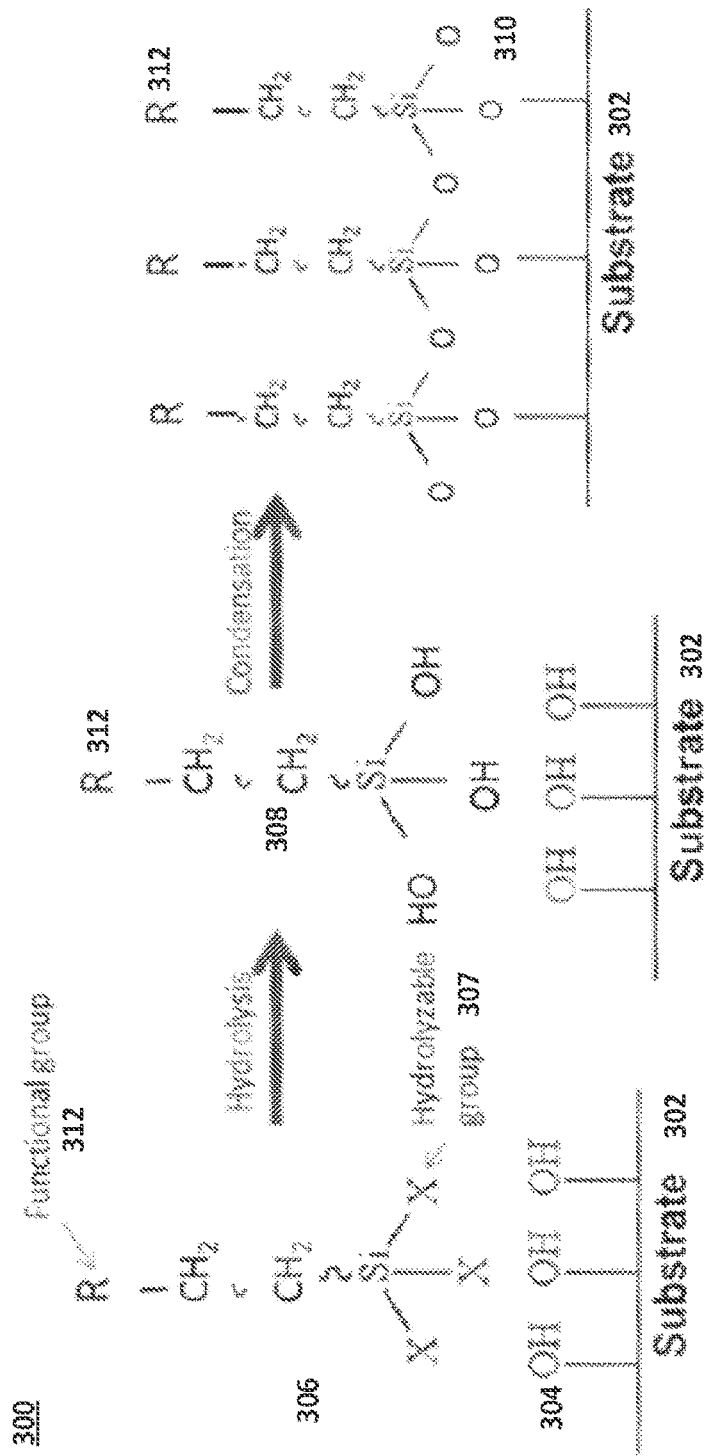
FIG. 3A-C are schematic diagrams of forming a self-assembled monolayer on a dielectric surface.

FIG. 3A-C are schematic diagrams 300 of forming a self-assembled monolayer (SAM) on a dielectric surface. In FIG. 3A, a dielectric substrate 302 may include hydrophilic surface active sites, such as hydroxide 304. The hydroxide 304 can be a result of processing on the dielectric, for example. The SAM can include a hydrolysable group 307 and a functional group 312. The SAM 306 and the substrate 302 can undergo hydrolysis to prepare the SAM 306 for anchoring to the substrate 302.

In FIG. 3B, the hydrolysis has resulted in an altered SAM molecule 308 that include methylene and hydroxide head groups. The substrate and SAM can undergo condensation to anchor the SAM to the substrate. In FIG. 3C, the condensation has resulted in a bonding between the remaining oxygen groups from the SAM and on the substrate 302. There is also a water byproduct. The result is a SAM 310 that is anchored to the substrate 302 and an exposed functional group R 312.

FIG. 4A is a schematic diagram 400 of chemisorption of a self-assembled monolayer with a electroless deposition catalyst material. The SAM 404 is anchored to the substrate 402. The SAM 404 also includes functional group R 406. The functional group R 406 can be reactive with a metal atom for terminating the SAM with a metal catalyst 408 for electroless deposition. The metal catalyst 408 can be introduced to the substrate by a bath or spin coating or other known technique. The metal catalyst 408 can undergo chemisorption to bind to the functional group R 406. In some example embodiments, the metal catalyst is palladium, but the metal catalyst can be selected based on the parameters of the electroless deposition, including the PH of the electroless bath, the reducing agent, and the metal to be deposited.

The Pd catalyst absorption will be carried out on the SAM activated area. Then, the catalyst activated structures will be subjected to the electroless bath where the Pd is oxidized while the metal is reduced to form first nuclei and then metal film allowing the metallization of lines of any shape and size.

FIG. 4B is a schematic diagram 450 of electroless metal deposition in accordance with embodiments of the present disclosure. FIG. 4B is representative of both an electroless deposition of a protective layer and an electroless deposition of an interconnect layer. For example, for the protective layer, an acidic bath can be used so as to not harm the SAM layer 404 (e.g., prevent the desorption of the SAM molecules 404 from the substrate 402). A reducing agent 412 can be selected based on a number of factors, such as the type of metal to be deposited, the type and/or amount of dopant desired in the protective layer, etc. In some instances, cobalt ions can be reduced to form cobalt nucleation sites on the palladium 408 terminating the SAM layer 404. The reducing agent 412 can oxidize, and resulting material can dope the cobalt protective layer.

For depositing an interconnect layer, an alkaline bath can be used to deposit metal onto the protective layer. A reducing agent 414 can be selected so that the resulting interconnect layer is composed of material characterized by high electrical conductivity. For example. Hydrazine can be used as a reducing agent in an alkaline-based electroless deposition of cobalt, resulting in pure (or substantially pure) cobalt as the interconnect layer. Other reducing agents can be used depending on the desired metal for the interconnect.

Figure 5:
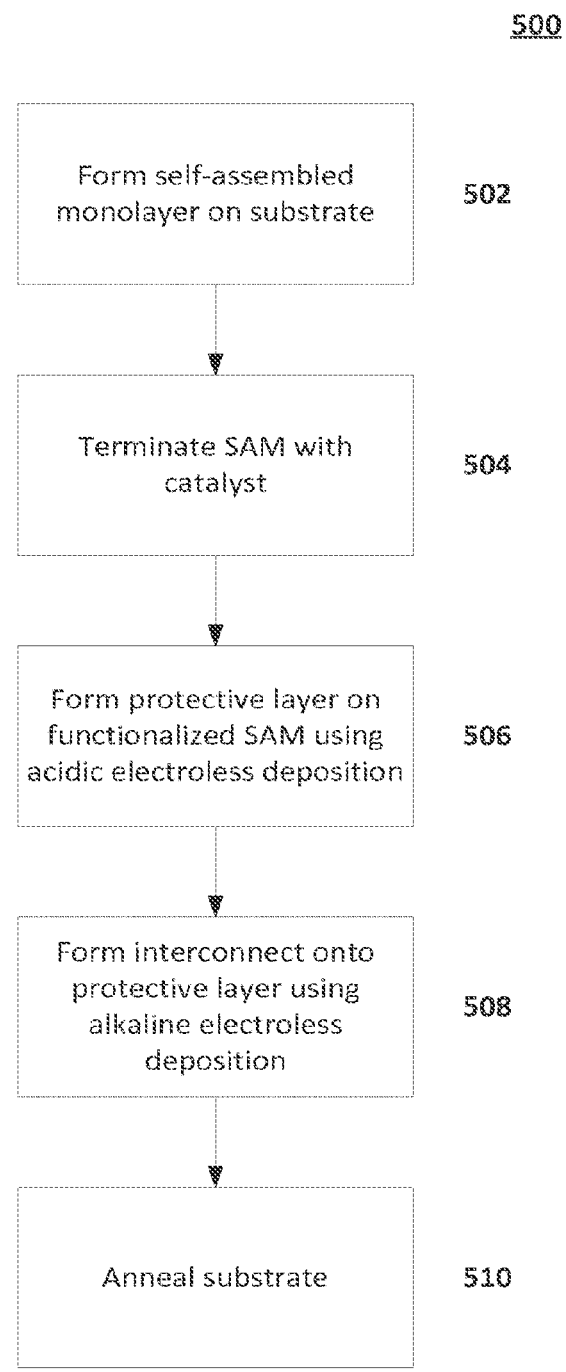
FIG. 5 is a process flow diagram for self-assembled monolayer directed electroless deposition of an interconnect in accordance with embodiments of the present disclosure.

FIG. 5 is a process flow diagram 500 for self-assembled monolayer directed electroless deposition of an interconnect in accordance with embodiments of the present disclosure. A self-assembled monolayer (SAM) can be formed on a dielectric surface (502). Forming the SAM layer can include a vapor phase deposition or atomic layer deposition technique. A hydrolysis-condensation sequence can be used to anchor the SAM to the dielectric surface.

In some embodiments where a SAM is used that does not include a metal atom termination, a metal atom can be added to the reactive terminal group of the SAM (504). The metal can be added by a wet bath or spin coating or other known techniques. The metal acts as a catalyst for electroless deposition and is required when the SAM has a terminal group that cannot catalyze the electroless deposition.

A protective layer can be added onto the SAM layer via electroless deposition (506). The metal catalyst can catalyze the electroless deposition of metal. The electroless deposition of the protective layer can be done using an acidic bath to protect the SAM from desorption from the dielectric substrate. A dopant can also be introduced into the formation of the protective layer. The dopant that is added can be a function of the reducing agent used in the protective layer electroless deposition.

An interconnect layer can be added onto the protective layer (508). The interconnect layer can be added using an alkaline-based electroless deposition. A reducing agent can be selected so that the interconnect layer can be composed of a material that has high electrical conductivity. For example, hydrazine can be used to deposit pure cobalt onto the protective layer.

Example electroless chemical reactions for cobalt are provided below:

EL Co Chemical Reactions
Catalytic surface reactions for EL Co
1. Catalytic oxidation of reducing agent (nucleation)

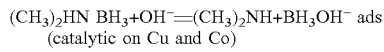
(catalytic on Cu and Co)

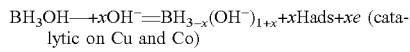
(catalytic on Cu and Co)

2. Overall reaction of Co reduction with DMAB as the reducing agents:

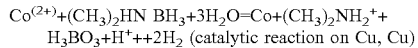
(catalytic reaction on Cu, Cu)

3. Overall reaction of metalloid dopant (B or P) incorporation into Co films

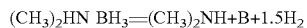

4. Bulk reaction for reducing agents
Overall reaction of reducing agent hydrolysis-bulk reaction in the plating solution

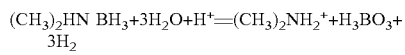

Overall reaction of Co reduction with Hydrazine as the reducing agents:

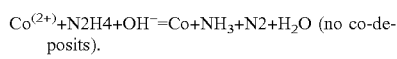
(no co-deposits).

The dielectric substrate, including the SAM, the protective layer, and the interconnect layer can be annealed (510). The annealing causes the interconnect layer to reflow and fill the trench (e.g., gapfill). The interconnect can be formed by reflowing the interconnect layer into the trench.

Figure 6:
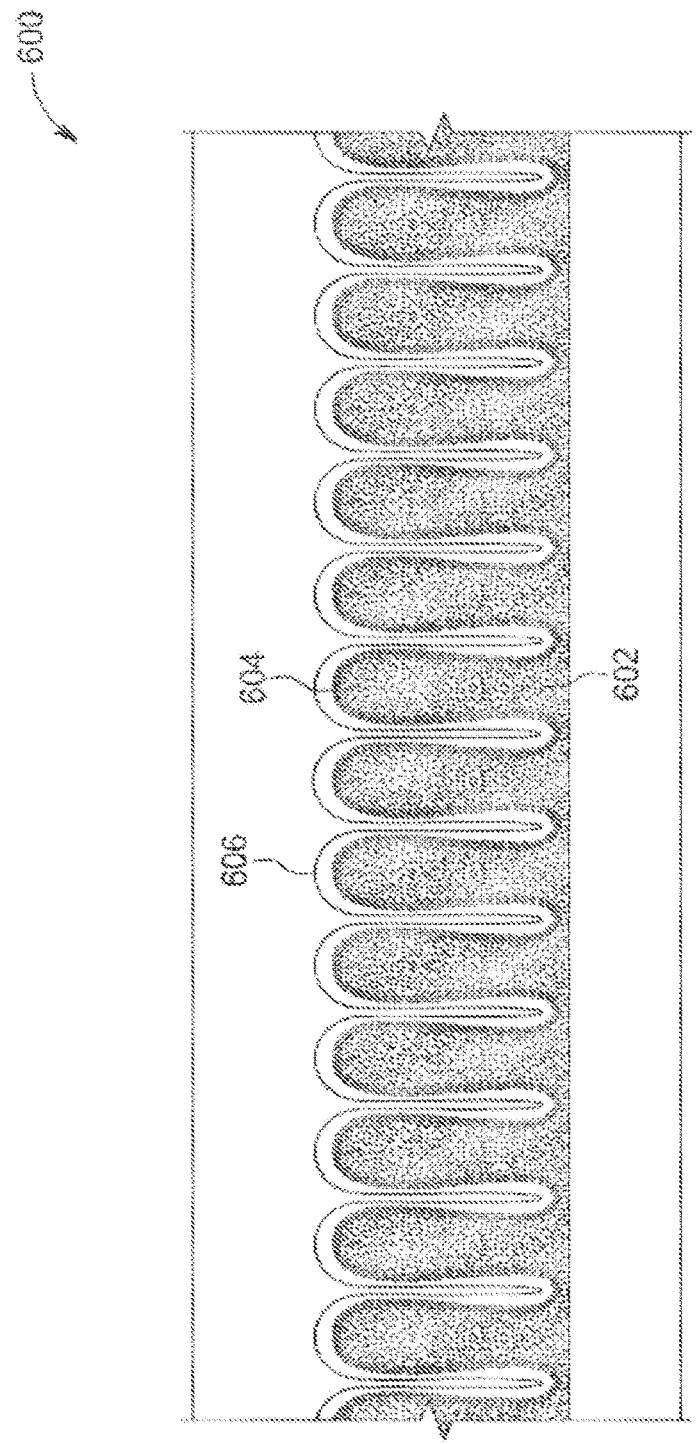
FIG. 6 is a scanning electron microscopy image of a cross section of a dielectric substrate with a self-assembled monolayer with a doped cobalt protective layer in accordance with embodiments of the present disclosure.

FIG. 6 is a scanning electron microscopy image 600 of a cross section of a dielectric substrate with a self-assembled monolayer with a doped cobalt protective layer in accordance with embodiments of the present disclosure.

FIG. 7A is a scanning electron microscopy image 700 of a cross section of a dielectric substrate with a self-assembled monolayer, a protective layer, and a metallization layer prior to annealing in accordance with embodiments of the present disclosure. The interface between the granular islands 704 and the amorphous material 706 can be seen via SEM imaging. The protective layer is the acidic cobalt and can be seen as "granular" islands 704 in the trenches and as a lower layer at the top of the towers. The interconnect layer is the alkaline cobalt and can be seen as amorphous material 706 covering the protective layer.

Figure 7B:
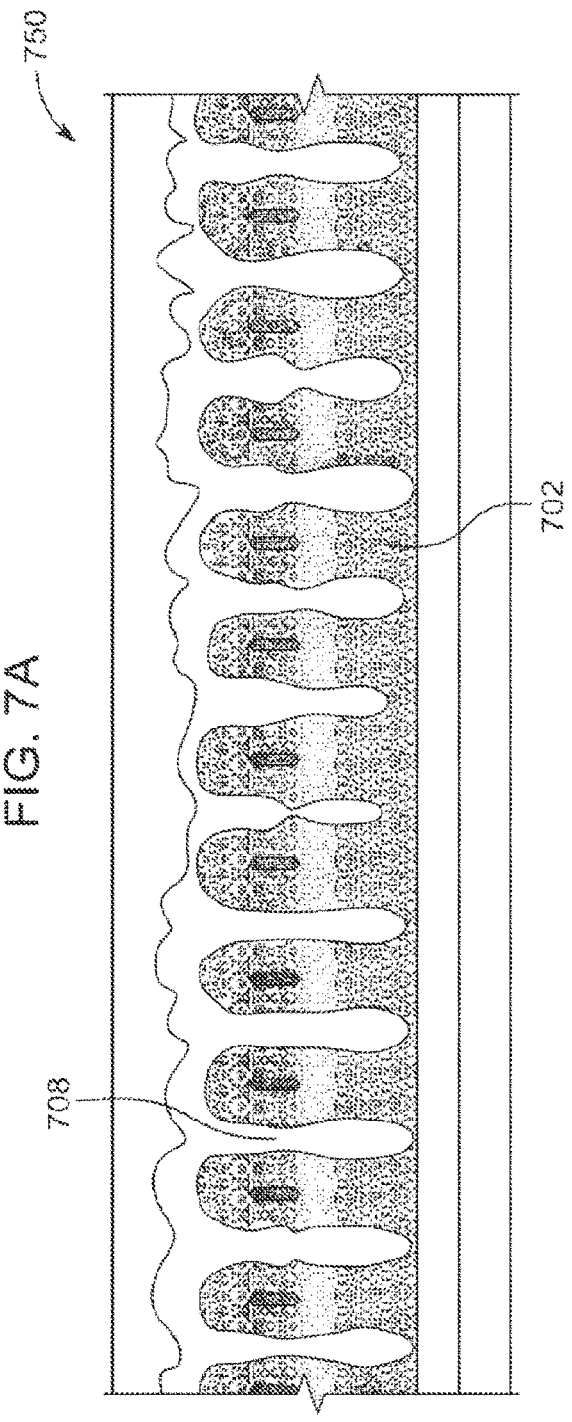
FIG. 7B is a scanning electron microscopy image of a cross section of a dielectric substrate with a self-assembled monolayer, a protective layer, and a metallization layer after annealing in accordance with embodiments of the present disclosure.

FIG. 7B is a scanning electron microscopy image 750 of a cross section of a dielectric substrate with a self-assembled monolayer, a protective layer, and a metallization layer after annealing in accordance with embodiments of the present disclosure. After the annealing, the interconnect layer can be observed to have filled the gaps in the trenches, and the interface between the protective layer and the interconnect layer is no longer immediately discernable or observable because the annealing can heal the grain boundaries.

Figure 8:
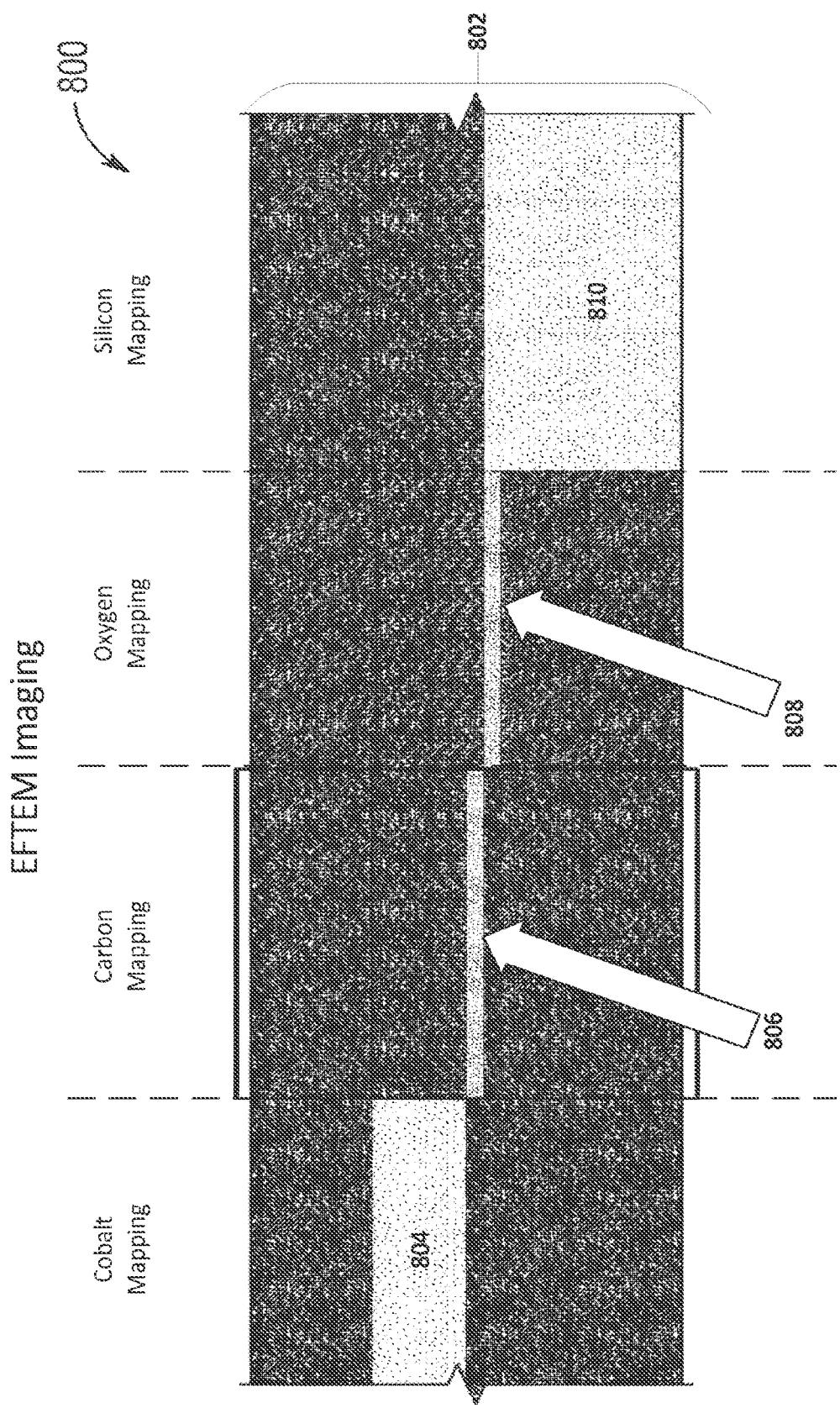
FIG. 8 is transmission electron microscopy image of a self-assembled monolayer between a dielectric layer and a metal layer in accordance with embodiments of the present disclosure.

FIG. 8 is transmission electron microscopy (TEM) image 800 of a self-assembled monolayer between a dielectric layer and a metal layer in accordance with embodiments of the present disclosure. Currently, High Resolution TEM plus Energy Dispersive X-ray Spectroscopy (EDX) elemental maps and Electron Energy Loss Spectroscopy can show a carbon dense layer (SAM) 802 between a dielectric and a metal as shown in FIG. 8. An EDS scan also will show the presence of the do pant in the side walls and pure metal core in the middle of the trench. For a carbon doped substrate, SAM detection can be performed using more sensitive techniques to differentiate the SAM dense carbon layer. For example, atom probe tomography can be used, as well as other techniques.

In the this description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 9:
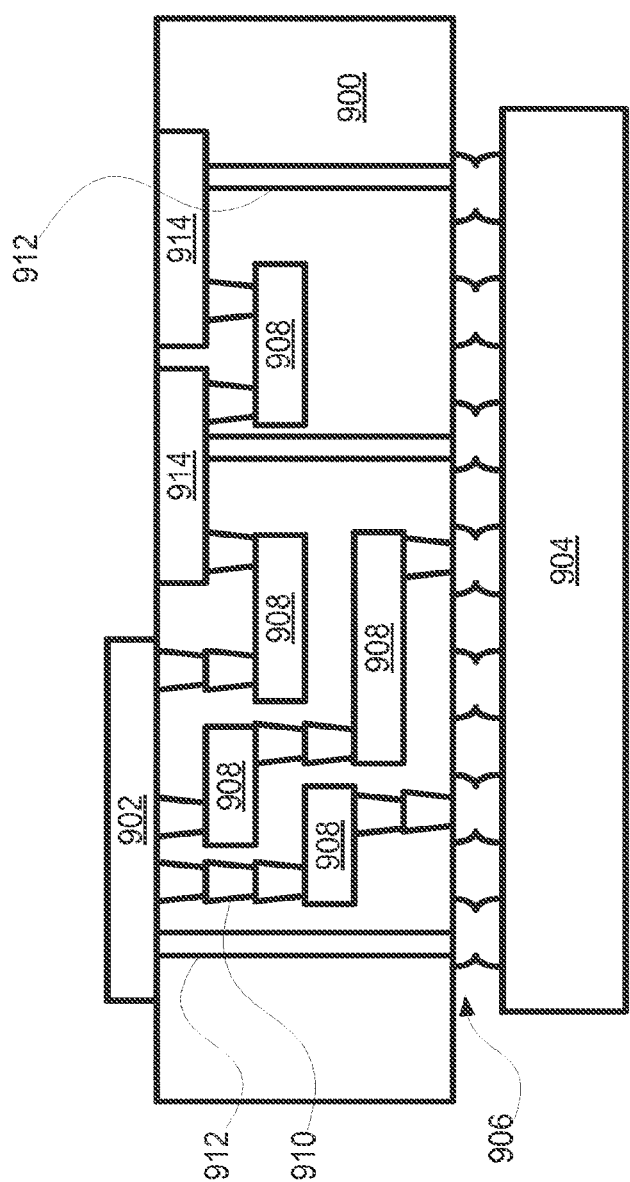
FIG. 9 is a schematic block diagram of an interposer that includes one or more embodiments of the disclosure.

FIG. 9 is a schematic block diagram of an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900.

In accordance with embodiments of the disclosure, apparatuses or processes disclosed herein may be used in the fabrication of interposer 900.

Figure 10:
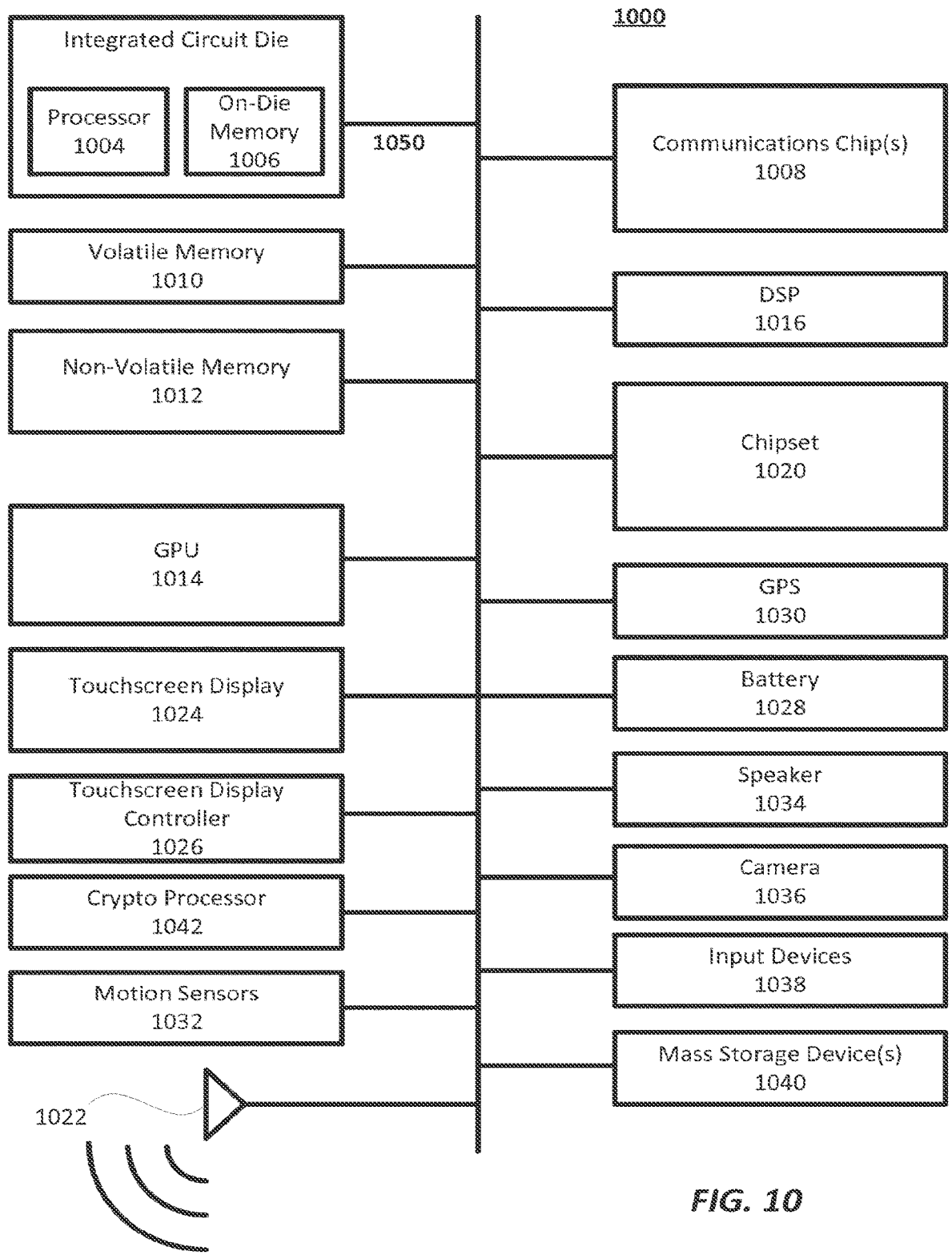
FIG. 10 is a schematic block diagram of a computing device in accordance with one embodiment of the disclosure.

FIG. 10 is a schematic block diagram of a computing device 1000 in accordance with one embodiment of the disclosure. The computing device 1000 may include a number of components. In one embodiment, these components are attached to one or more motherboards. In an alternate embodiment, some or all of these components are fabricated onto a single system-on-a-chip (SoC) die. The components in the computing device 1000 include, but are not limited to, an integrated circuit die 1002 and at least one communications logic unit 1008. In some implementations the communications logic unit 1008 is fabricated within the integrated circuit die 1002 while in other implementations the communications logic unit 1008 is fabricated in a separate integrated circuit chip that may be bonded to a substrate or motherboard that is shared with or electronically coupled to the integrated circuit die 1002. The integrated circuit die 1002 may include a CPU 1004 as well as on-die memory 1006, often used as cache memory, that can be provided by technologies such as embedded DRAM (eDRAM) or spin-transfer torque memory (STTM or STT-MRAM).

Computing device 1000 may include other components that may or may not be physically and electrically coupled to the motherboard or fabricated within an SoC die. These other components include, but are not limited to, volatile memory 1010 (e.g., DRAM), non-volatile memory 1012 (e.g., ROM or flash memory), a graphics processing unit 1014 (GPU), a digital signal processor 1016, a crypto processor 1042 (a specialized processor that executes cryptographic algorithms within hardware), a chipset 1020, an antenna 1022, a display or a touchscreen display 1024, a touchscreen controller 1026, a battery 1028 or other power source, a power amplifier (not shown), a voltage regulator (not shown), a global positioning system (GPS) device 1028, a compass 1030, a motion coprocessor or sensors 1032 (that may include an accelerometer, a gyroscope, and a compass), a speaker 1034, a camera 1036, user input devices 1038 (such as a keyboard, mouse, stylus, and touchpad), and a mass storage device 1040 (such as hard disk drive, compact disk (CD), digital versatile disk (DVD), and so forth).

The communications logic unit 1008 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communications logic units 1008. For instance, a first communications logic unit 1008 may be dedicated to shorter range wireless communications such as Wi-Fi and Bluetooth and a second communications logic unit 1008 may be dedicated to longer range wireless communications such as GPS, EDGE, GPRS, CDMA, WiMAX, LTE. Ev-DO, and others.

The processor 1004 of the computing device 1000 includes one or more devices, such as metal interconnects 1050, that are formed in accordance with embodiments of the disclosure. The term "processor" may refer to any device or portion of a device that processes electronic data from registers and/or memory to transform that electronic data into other electronic data that may be stored in registers and/or memory.

The communications logic unit 1008 may also include one or more devices, such as metal interconnects 1050, that are formed in accordance with embodiments of the disclosure.

In further embodiments, another component housed within the computing device 1000 may contain one or more devices, such as metal interconnects 1050, that are formed in accordance with implementations of the disclosure.

In various embodiments, the computing device 1000 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In some embodiments, the computing device 1000 includes one or more integrated circuits that include metal interconnects 1050. Metal interconnects 1050 can include a self-assembled monolayer that can be functionalized with a catalyst for electroless plating of metal, as described in this disclosure. The metal interconnects use a metal that do not require a diffusion barrier but can achieve comparable conductivity as copper systems.

The following paragraphs provide examples of various ones of the embodiments disclosed herein.

Example 1 is a method of forming an interconnect that include forming a self-assembled monolayer (SAM) on a substrate; forming a protective layer on the SAM; forming an interconnect layer on the protective layer, the protective layer seeding the interconnect layer; and annealing the dielectric substrate.

Example 2 may include the subject matter of example 1, wherein the SAM comprises one of a thiol, an amine, carboxylic acid, carboxylate salt, analine, Pyridyl, or a metal atom terminated head group.

Example 3 may include the subject matter of any of examples 1 or 2, wherein forming the SAM comprises forming the SAM by vapor phase deposition or atomic layer deposition.

Example 4 may include the subject matter of any of examples 1 or 2 or 3, wherein the dielectric substrate comprises a number of surface active sites, the SAM forming on the surface active site.

Example 5 may include the subject matter of any of example 1 or 2 or 3 or 4, wherein the surface active sites are hydrophilic.

Example 6 may include the subject matter of any of example 1 or 2 or 3 or 4 or 5, wherein the surface active sites comprise hydroxide.

Example 7 may include the subject matter of any of example 1 or 2 or 3 or 4 or 6, wherein forming the protective layer on the SAM comprises forming the protective layer from an electroless bath.

Example 8 may include the subject matter of any of example 1 or 2 or 3 or 4 or 6 or 7, wherein the electroless bath comprises an acidic electroless bath.

Example 9 may include the subject matter of any of example 1 or 2 or 3 or 4 or 6 or 7 or 8, wherein the protective layer comprises doped cobalt.

Example 10 may include the subject matter of any of example 1 or 2 or 3 or 4 or 6 or 7 or 8 or 9, wherein forming the interconnect layer on the protective layer comprises forming the interconnect layer from an electroless bath.

Example 11 may include the subject matter of any of example 1 or 2 or 3 or 4 or 6 or 7 or 8 or 9 or 10, wherein the electroless bath comprises an alkaline bath.

Example 12 may include the subject matter of any of example 1 or 2 or 3 or 4 or 6 or 7 or 8 or 9 or 10 or 11, wherein the electroless bath comprises a Hydrazine reducing agent.

Example 13 may include the subject matter of any of example 1 or 2 or 3 or 4 or 6 or 7 or 8 or 9 or 10 or 11 or 12, wherein the interconnect layer comprises pure cobalt.

Example 14 may include the subject matter of any of example 1 or 2 or 3 or 4 or 6 or 7 or 8 or 9 or 10 or 11 or 12 or 13, also including terminating the SAM with a catalyst prior to forming the protective layer, and wherein forming the protective layer on the SAM comprises forming the protective layer with the catalyst group.

Example 15 includes the subject matter of example 14, wherein the catalyst group comprises palladium.

Example 16 is device that includes a substrate comprising a layer of dielectric material forming a trench; a self-assembled monolayer (SAM) in contact with the dielectric material in the trench; and a metallization layer, the SAM residing between the dielectric material and the metallization layer.

Example 17 may include the subject matter of example 16, and also include a protective layer residing between the SAM and the metallization layer.

Example 18 may include the subject matter of example 17, wherein the protective layer comprises doped cobalt and the metallization layer comprises pure cobalt.

Example 19 may include the subject matter of any of examples 16 or 17 or 18, wherein the metallization layer electrically interconnects components of the device.

Example 20 may include the subject matter of any of example 16 or 17 or 18 or 19, wherein the SAM comprises carbon.

Example 21 may include the subject matter of any of example 16 or 17 or 18 or 19 or 20, wherein the dielectric comprises silicon oxide.

Example 22 may include the subject matter of example 16, wherein the metallization layer comprises one of cobalt, ruthenium, platinum, palladium, tungsten, iridium, rhenium or nickel.

Example 23 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; a voltage regulator within the processor; and wherein the computing device includes an integrated circuit. The integrated circuit includes a substrate comprising a layer of dielectric material forming a trench; a self-assembled monolayer (SAM) in contact with the dielectric material in the trench; and an interconnect layer, the SAM residing between the dielectric material and the interconnect layer.

Example 24 may include the subject matter of claim 23, and also include a protective layer residing between the SAM and the interconnect layer.

Example 25 may include the subject matter of example 24, wherein the protective layer comprises doped cobalt and the interconnect layer comprises pure cobalt.

Example 26 may include the subject matter of any of examples 23 or 24 or 25, wherein the interconnect layer electrically interconnects components of the device.

Example 27 may include the subject matter of any of examples 23 or 24 or 25 or 26, wherein the SAM comprises carbon.

Example 28 may include the subject matter of any of examples 23 or 24 or 25 or 26 or 27, wherein the dielectric comprises silicon oxide.

Example 29 may include the subject matter of any of examples 23 or 24 or 26 or 27 or 28, wherein the interconnect layer comprises one of cobalt, ruthenium, platinum, palladium, tungsten, iridium, rhenium or nickel.

Example 30 may include the subject matter of any of examples 23 or 24 or 25 or 26 or 27 or 28 or 29, wherein the SAM includes one of a thiol, an amine, carboxylic acid, carboxylate salt, analine, Pyridyl, or a metal atom terminated head group Example 31 is a system for forming an interconnect. The system may include a means for forming a self-assembled monolayer (SAM) on a substrate; a means for forming a protective layer on the SAM; a means for forming an interconnect layer on the protective layer, the protective layer seeding the interconnect layer, and a means for annealing the dielectric substrate.

Example 32 may include the subject matter of example 31, wherein the SAM includes one of a thiol, an amine, carboxylic acid, carboxylate salt, analine. Pyridyl, or a metal atom terminated head group.

Example 33 may include the subject matter of any of examples 32 or 33, wherein the means for forming the SAM comprises vapor phase deposition or atomic layer deposition.

Example 34 may include the subject matter of any of examples 32 or 33 or 33, wherein the dielectric substrate comprises a number of surface active sites, the SAM forming on the surface active site.

Example 35 may include the subject matter of any of examples 34, wherein the surface active sites are hydrophilic.

Example 36 may include the subject matter of any of examples 34 or 35, wherein the surface active sites comprise hydroxide.

Example 37 may include the subject matter of example 31 or 32 or 33 or 34 or 35 or 36, wherein means for forming the protective layer on the SAM comprises an electroless bath.

Example 38 may include the subject matter of example 37, wherein the electroless bath includes an acidic electroless bath.

Example 39 may include the subject matter of any of examples 31 or 32 or 33 or 34 or 35 or 36 or 37 or 38, wherein the protective layer comprises doped cobalt and wherein the interconnect layer comprises pure cobalt.

Example 40 may include the subject matter of any of examples 31 or 32 or 33 or 34 or 35 or 36 or 37 or 38 or 39, wherein means for forming the interconnect layer on the protective layer includes an electroless bath.

Example 41 may include the subject matter of example 40, wherein the electroless bath includes an alkaline bath.

Example 42 may include the subject matter of any of examples 40 or 41, wherein the electroless bath includes a Hydrazine reducing agent.

Example 43 may include the subject matter of any of examples 31 or 32 or 33 or 34 or 35 or 36 or 37 or 38 or 39 or 40 or 41 or 42, and also include a means for terminating the SAM with a catalyst prior to forming the protective layer, and wherein forming the protective layer on the SAM includes forming the protective layer with the catalyst group.

Example 44 may include the subject matter of example 43, wherein the catalyst group comprises palladium.

Example 45 may include the subject matter of any of examples 31 or 32 or 33 or 34 or 35 or 36 or 37 or 38 or 40 or 41 or 42 or 43 or 44, wherein the interconnect layer comprises one of cobalt, ruthenium, platinum, palladium, tungsten, iridium, rhenium or nickel.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A device comprising:
   a substrate comprising a trench in a dielectric material;
   a self-assembled monolayer (SAM) over at least a portion of a bottom of the trench and in contact with the dielectric material in the trench; and
   an interconnect material, the SAM residing between the dielectric material and the interconnect material.

2. The device of claim 1, wherein the interconnect material comprises one of cobalt, ruthenium, platinum, palladium, tungsten, iridium, rhenium or nickel.

3. The device of claim 1, further comprising a protective material residing between the SAM and the interconnect material.

4. The device of claim 3, wherein the protective material comprises doped cobalt and the interconnect material comprises pure cobalt.

5. The device of claim 1, wherein the SAM comprises carbon.

6. The device of claim 1, wherein the dielectric comprises silicon oxide.

7. The device of claim 1, wherein at least one dimension of the trench is below 10 nanometers.

8. The device of claim 7, wherein the at least one dimension is a width.

9. The device of claim 1, wherein the SAM comprises siloxane.

10. The device of claim 1, wherein the SAM comprises siloxane terminated with a thiol.

11. The device of claim 1, wherein the SAM comprises siloxane terminated with a carboxylate salt.

12. The device of claim 1, wherein the SAM comprises siloxane terminated with an amino radical.

13. The device of claim 1, wherein the SAM comprises siloxane terminated with an aniline.

14. The device of claim 1, wherein the SAM comprises siloxane terminated with a metal atom.

15. The device of claim 1, wherein the SAM comprises siloxane terminated with a Pyridyl.

16. The device of claim 1, wherein:
   the SAM lines sidewalls and the bottom of the trench,
   the device further includes a protective material that lines the sidewalls and the bottom of the trench lined with the SAM so that the SAM is between the protective material and the dielectric material, and
   the interconnect material is in a gap formed by the protective material lining the sidewalls and the bottom of the trench lined with the SAM.

17. The device of claim 16, wherein a width of a portion of the gap that is closest to the bottom of the trench is greater than a width of a portion of the gap that is at a top of the trench.

18. The device of claim 16, wherein the protective material includes a first metal, the interconnect material includes a second metal, and the first metal is less conductive than the second metal.

19. A computing device comprising:
   a processor mounted on a substrate;
   a communications logic unit within the processor;
   a memory within the processor; and
   an integrated circuit, the integrated circuit comprising:
   a substrate comprising a layer of dielectric material forming a trench;
   a self-assembled monolayer (SAM) over at least a portion of a bottom of the trench and in contact with the dielectric material in the trench;

an interconnect material, the SAM residing between the dielectric material and the interconnect material; and a protective material residing between the SAM and the interconnect material;

wherein the dielectric material comprises silicon oxide.

20. The computing device of claim 19, wherein the interconnect material comprises one of cobalt, ruthenium, platinum, palladium, tungsten, iridium, rhenium or nickel.

21. The computing device of claim 19, wherein the protective material comprises doped cobalt and the interconnect material comprises pure cobalt.

22. The computing device of claim 19, wherein the SAM comprises carbon.

23. The computing device of claim 19, wherein at least one dimension of the trench is below 10 nanometers.

24. The computing device of claim 19, wherein the SAM comprises siloxane.

25. The computing device of claim 19, wherein the SAM comprises siloxane terminated with one of a thiol, a carboxylate salt, an aniline, an amino radical, or a metal atom.

* * * * *